(12) United States Patent
Zhang et al.

(10) Patent No.: US 12,351,897 B2
(45) Date of Patent: Jul. 8, 2025

(54) MASK AND MANUFACTURING METHOD THEREFOR

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yuanqi Zhang, Beijing (CN); Sen Du, Beijing (CN); Chang Luo, Beijing (CN); Fengli Ji, Beijing (CN); Xiaoyu Yang, Beijing (CN); Qian Xu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 866 days.

(21) Appl. No.: 17/607,012

(22) PCT Filed: Dec. 24, 2020

(86) PCT No.: PCT/CN2020/138863
§ 371 (c)(1),
(2) Date: Oct. 27, 2021

(87) PCT Pub. No.: WO2021/136051
PCT Pub. Date: Jul. 8, 2021

(65) Prior Publication Data
US 2022/0216412 A1    Jul. 7, 2022

(30) Foreign Application Priority Data
Jan. 3, 2020   (CN) .......................... 202010006257.3

(51) Int. Cl.
*H01L 51/00* (2006.01)
*C23C 14/04* (2006.01)
(Continued)

(52) U.S. Cl.
CPC ............ *C23C 14/042* (2013.01); *C23C 14/24* (2013.01); *H10K 71/00* (2023.02); *H10K 71/164* (2023.02); *H10K 71/166* (2023.02)

(58) Field of Classification Search
None
See application file for complete search history.

(56) References Cited

U.S. PATENT DOCUMENTS 9,343,679 B2 *   5/2016   Hirobe ................... H10K 71/00
9,548,453 B2 *   1/2017   Hirobe ................. C23C 14/042
(Continued)

FOREIGN PATENT DOCUMENTS

CN   105039907 A   11/2015
CN   105839052 A    8/2016
(Continued)

OTHER PUBLICATIONS

The First Office Action of Priority Application No. CN 202010006257.3 issued by the Chinese Patent Office on Apr. 2, 2021.
(Continued)

*Primary Examiner* — Jethro M. Pence
(74) *Attorney, Agent, or Firm* — XSENSUS LLP

(57) ABSTRACT

A mask includes a frame, at least one mask sheet, and a shielding plate. The frame includes a plurality of borders. The borders are connected end to end in sequence to form the frame with a first hollow region. A mask sheet includes a pattern region and non-pattern regions. The pattern region includes at least one evaporation hole. The shielding plate includes a plurality of shielding strips. The plurality of shielding strips are arranged crosswise to form a plurality of
(Continued)

second hollow regions. Orthogonal projections of the second hollow regions on a plane perpendicular to a thickness direction of the frame are located within a range of an orthogonal projection of the first hollow region on the plane. An inner edge of an orthogonal projection of the frame on the plane is located within a range of an orthogonal projection of the shielding plate on the plane.

20 Claims, 9 Drawing Sheets

(51) Int. Cl.
*C23C 14/24* (2006.01)
*H01L 51/56* (2006.01)
*H10K 71/00* (2023.01)
*H10K 71/16* (2023.01)

(56) References Cited

U.S. PATENT DOCUMENTS

| | | | |
|---|---|---|---|
| 9,975,134 B2 * | 5/2018 | Ko | B05B 12/20 |
| 10,186,662 B2 * | 1/2019 | Kim | H10K 71/00 |
| 10,465,277 B2 * | 11/2019 | Xu | C23C 14/24 |
| 10,787,729 B2 * | 9/2020 | Bai | C23C 14/24 |
| 10,787,731 B2 * | 9/2020 | Xie | C23C 14/042 |
| 10,829,847 B2 * | 11/2020 | Zhang | B05C 21/005 |
| 11,041,237 B2 * | 6/2021 | Takeda | B05C 21/005 |
| 11,066,737 B2 * | 7/2021 | Li | B05C 21/005 |
| 11,155,913 B2 * | 10/2021 | Yuan | C23C 14/12 |
| 11,203,808 B2 * | 12/2021 | Zhu | H10K 71/00 |
| 11,396,693 B2 * | 7/2022 | Bai | B05C 21/005 |
| 11,566,323 B2 * | 1/2023 | Huang | G06F 1/189 |
| 11,885,004 B2 * | 1/2024 | Mu | C23C 14/042 |
| 11,937,492 B2 * | 3/2024 | Lee | G03F 7/0015 |
| 12,037,678 B2 * | 7/2024 | Pan | C23C 14/042 |
| 2017/0110662 A1 * | 4/2017 | Hirobe | C23C 16/042 |
| 2017/0222145 A1 | 8/2017 | Kim | |
| 2017/0365822 A1 | 12/2017 | Kim | |
| 2018/0202034 A1 | 7/2018 | Lin et al. | |
| 2018/0312957 A1 | 11/2018 | Zhang | |
| 2019/0185985 A1 | 6/2019 | Xie et al. | |
| 2019/0296240 A1 * | 9/2019 | Hirobe | H10K 71/166 |
| 2020/0362449 A1 * | 11/2020 | Zhang | C23C 14/042 |
| 2020/0395545 A1 * | 12/2020 | Hirobe | H10K 71/166 |
| 2021/0013415 A1 * | 1/2021 | Kawasaki | C23C 16/042 |
| 2022/0002858 A1 * | 1/2022 | Jiang | B05C 21/005 |
| 2023/0085315 A1 * | 3/2023 | Bi | B23P 15/00 |
| | | | 118/721 |
| 2023/0357913 A1 * | 11/2023 | Guo | C23C 14/042 |
| 2024/0093349 A1 * | 3/2024 | Mu | C23C 14/12 |

FOREIGN PATENT DOCUMENTS

| | | |
|---|---|---|
| CN | 106884140 A | 6/2017 |
| CN | 107435130 A | 12/2017 |
| CN | 107523786 A | 12/2017 |
| CN | 107653437 A | 2/2018 |
| CN | 207159336 U | 3/2018 |
| CN | 108004503 A | 5/2018 |
| CN | 110343999 A | 10/2019 |
| CN | 110527949 A | 12/2019 |
| CN | 111088474 A | 5/2020 |

OTHER PUBLICATIONS

The Second Office Action of Priority Application No. CN 202010006257.3 issued by the Chinese Patent Office on Sep. 28, 2021.

* cited by examiner

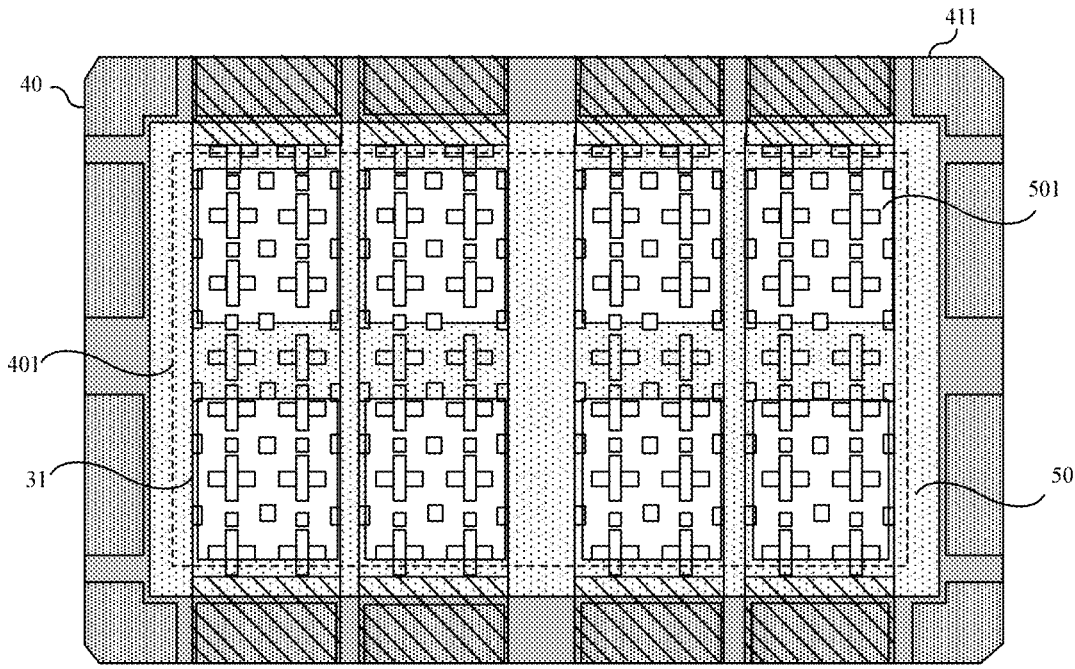

FIG. 11

| Stretch the shielding plate and weld the shielding plate to the first region of the frame, the inner edge of the frame being located within the range of the orthogonal projection of the shielding plate on the frame | — S101 |

↓

| Stretch the at least one mask sheet and weld the at least one mask sheet to the second region of the frame, the at least one mask sheet and the shielding plate being located on a same side of the frame | — S102 |

FIG. 12

MASK AND MANUFACTURING METHOD THEREFOR

CROSS-REFERENCE TO RELATED APPLICATIONS

This application is a national phase entry under 35 USC 371 of International Patent Application No. PCT/CN2020/138863, filed on Dec. 24, 2020, which claims priority to Chinese Application No. 202010006257.3, filed on Jan. 3, 2020, which are incorporated herein by reference in their entirety.

TECHNICAL FIELD

The present disclosure relates to the field of display technologies, and in particular, to a mask and a manufacturing method therefor.

BACKGROUND

An organic light-emitting diode (OLED) has advantages of self-luminescence, low energy consumption, lightness and thinness, high color saturation, etc., and may be manufactured into a flexible display device based on a flexible material, which is widely used in various electronic devices including electronic products such as computers and mobile phones.

The OLED is self-luminous due to a self-luminous organic material. The self-luminous organic material is mainly deposited on a substrate by an evaporation method, and a mask is required to form different luminous material patterns.

SUMMARY

In an aspect, a mask is provided. The mask includes a frame, at least one mask sheet, and a shielding plate. The frame includes a plurality of borders, and the plurality of borders are connected end to end in sequence to form the frame with a first hollow region. A mask sheet in the at least one mask sheet includes a pattern region and non-pattern regions. The pattern region includes at least one evaporation hole, and the non-pattern regions are configured to be fixed to the frame, so that the pattern region is opposite to the first hollow region. The shielding plate includes a plurality of shielding strips, and the plurality of shielding strips are arranged crosswise to form a plurality of second hollow regions. Orthogonal projections of the second hollow regions on a plane perpendicular to a thickness direction of the frame are located within a range of an orthogonal projection of the first hollow region on the plane. The shielding plate and the at least one mask sheet are sequentially fixed on the frame in the thickness direction of the frame, and an inner edge of an orthogonal projection of the frame on the plane is located within a range of an orthogonal projection of the shielding plate on the plane.

In some embodiments, the frame includes a first region and a second region. The first region includes a portion of the frame fixed to the plurality of shielding strips, and the portion of the frame fixed to the plurality of shielding strips is a shielding strip fixing region. The second region includes a portion of the frame fixed to the at least one mask sheet. A thickness of the first region is less than a thickness of the second region, and the second region is closer to an outer edge of the frame than the first region.

In some embodiments, a difference between the thickness of the second region and the thickness of the first region is equal to a thickness of the shielding plate.

In some embodiments, the plurality of shielding strips include a plurality of border shielding strips that are in one-to-one correspondence with the plurality of borders. For any border shielding strip, an orthogonal projection of the border shielding strip on the frame is located within a region where a border corresponding to the border shielding strip is located.

In some embodiments, the plurality of shielding strips include a plurality of border shielding strips that are in one-to-one correspondence with the plurality of borders. For any border shielding strip, an orthogonal projection of the border shielding strip on the plane is partially overlapped with an orthogonal projection of a border corresponding to the order shielding strip on the plane.

In some embodiments, the plurality of shielding strips include a plurality of border shielding strips that are in one-to-one correspondence with the plurality of borders. The shielding plate further includes at least one stretching pin located on an outer side of each border shielding strip.

In some embodiments, the first region further includes pin accommodating regions configured to accommodate stretching pins.

In some embodiments, the first region further includes fitting allowance regions. The fitting allowance regions are located between the shielding strip fixing region and the second region, and between the pin accommodating regions and the second region.

In some embodiments, the plurality of borders include two first borders that are opposite to each other and two second borders that are opposite to each other. The first region and the second region are included in the first borders and the second borders.

In some embodiments, the plurality of borders include two first borders that are opposite to each other and two second borders that are opposite to each other. The first region and the second region are included in the first borders, and the first region is further included in the second borders.

In some embodiments, a length of the pattern region is greater than a length of the first hollow region in a direction of a line connecting the two first borders that are opposite to each other.

In some embodiments, the frame further includes first alignment holes that are non-overlapped with the at least one mask sheet and the shielding plate.

In some embodiments, the frame further includes a second alignment hole, and the at least one stretching pin further includes a third alignment hole. When the shielding plate is stretched on the frame, the second alignment hole is aligned with the third alignment hole.

In some embodiments, the frame and the shielding plate are made of an iron-nickel alloy or stainless steel. The at least one mask sheet is made of an iron-nickel alloy.

In some embodiments, the frame and the shielding plate are fixed in a welding manner. The frame and the at least one mask sheet are fixed in the welding manner.

In another aspect, a manufacturing method of a mask is provided for manufacturing the mask described above. Furthermore, the frame of the mask further includes a first region and a second region. A thickness of the first region is less than a thickness of the second region, and the second region is closer to an outer edge of the frame than the first region.

The manufacturing method includes: stretching the shielding plate and welding the shielding plate to the first region of the frame, the inner edge of the orthogonal projection of the frame on the plane being located within the range of the orthogonal projection of the shielding plate on the plane; and stretching the at least one mask sheet and welding the at least one mask sheet to the second region of the frame, the at least one mask sheet and the shielding plate being located on a same side of the frame.

In some embodiments, the plurality of shielding strips include a plurality of border shielding strips, and the shielding plate further includes the at least one stretching pin located on an outer side of each border shielding strip. The first region includes a shielding strip fixing region and pin accommodating regions. Stretching the shielding plate and welding the shielding plate to the first region of the frame, includes: placing the shielding plate on the frame, and fixing and stretching stretching pins of the shielding plate through a stretcher, so that the plurality of border shielding strips are located in the shielding strip fixing region, and the stretching pins are located in the pin accommodating regions; welding the plurality of border shielding strips to the shielding strip fixing region; and welding the stretching pins to the pin accommodating regions.

In some embodiments, the plurality of shielding strips include a plurality of border shielding strips, and the shielding plate further includes at least one stretching pin located on an outer side of each border shielding strip. The first region includes a shielding strip fixing region and pin accommodating regions. Stretching the shielding plate and welding the shielding plate to the first region of the frame, includes: placing the shielding plate on the frame, and fixing and stretching stretching pins of the shielding plate through a stretcher, so that the plurality of border shielding strips are located in the shielding strip fixing region, and the stretching pins are located in the pin accommodating regions; welding the plurality of border shielding strips to the shielding strip fixing region; and removing the stretching pins.

In some embodiments, the plurality of shielding strips include a plurality of border shielding strips that are in one-to-one correspondence with the plurality of borders. The inner edge of the orthogonal projection of the frame on the plane being located within the range of the orthogonal projection of the shielding plate on the plane, includes: for any border shielding strip, an orthogonal projection of the border shielding strip on the frame being located within a region where a border corresponding to the border shielding strip is located; or, for any border shielding strip, an orthogonal projection of the border shielding strip on the plane is partially overlapped with an orthogonal projection of a border corresponding to the order shielding strip on the plane.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

FIG. 11 is a structural diagram of another mask, in accordance with some embodiments; and FIG. 12 is a flowchart of a manufacturing process of a mask, in accordance with some embodiments.

DETAILED DESCRIPTION

Figure 1:
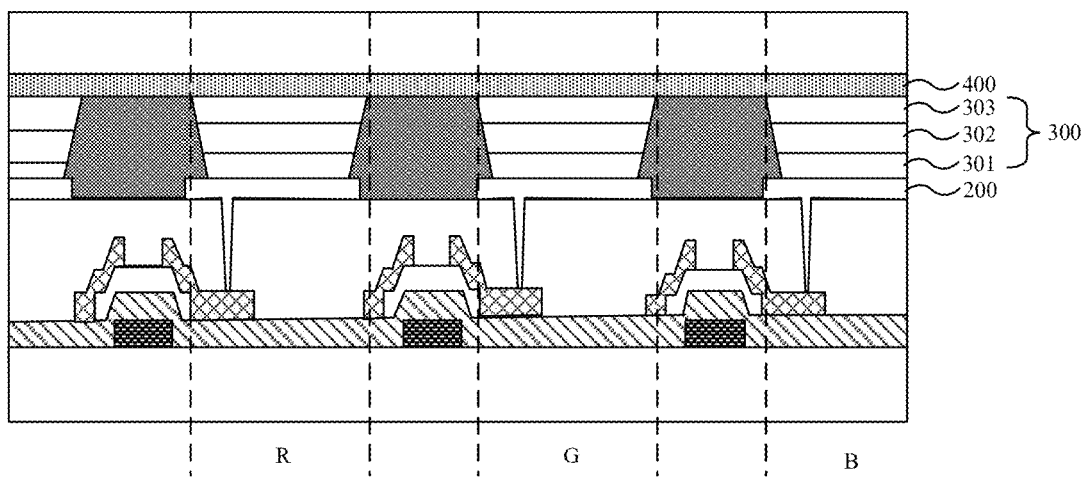
FIG. 1 is a structural diagram of an OLED display panel, in accordance with some embodiments.

Technical solutions in some embodiments of the present disclosure will be described clearly and completely below with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "an example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms such as "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, a plurality of/the plurality of means two or more unless otherwise specified.

In the description of some embodiments of the present disclosure, it will be understood that orientations or positional relationships indicated by the terms such as "center", "upper", "lower", "front", "rear", "left", "right", "vertical", "horizontal", "top", "bottom", "inner", "outer" are based on orientations or positional relationships shown in the drawings, which are merely for convenience of describing the present disclosure and simplifying the description, but not to indicate or imply that the indicated apparatus or element must have a specific orientation, or be constructed or operated in a specific orientation, therefore cannot be construed as a limitation of the present disclosure.

In the description of some embodiments, the terms "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the content herein.

Some embodiments of the present disclosure provide a mask. The mask may be, for example, used in a manufacturing process of an OLED display panel.

A plurality of OLED devices are provided in the OLED display panel. The OLED device may realize self-luminescence, and thus a backlight source is not required to be provided in a display apparatus including the OLED display panel.

For example, a schematic structural diagram of the OLED display panel is shown in FIG. 1. The OLED device therein includes an anode 200, a cathode 400, and a light-emitting functional layer 300 located between the anode 200 and the cathode 400. The light-emitting functional layer 300 may include an organic light-emitting layer 302, a hole transport layer 301 located between the organic light-emitting layer 302 and the anode 200, and an electron transport layer 303 located between the organic light-emitting layer 302 and the cathode 400. In addition, in some embodiments, a hole injection layer may be provided between the hole transport layer 301 and the anode 200, and an electron injection layer is provided between the electron transport layer 303 and the cathode 400 as needed. It will be noted that FIG. 1 exemplarily shows that the hole transport layers 301 in different OLED devices are disconnected, and the electron transport layers 303 in different OLED devices are disconnected, but the embodiments of the present disclosure are not limited thereto. In some embodiments, the hole transport layers 301 in different OLED devices may also be connected as a whole, and the electron transport layers 303 in different OLED devices may also be connected as a whole.

When the OLED display panel is displaying, by applying a voltage to the anode 200 and the cathode 400, electrons in the cathode 400 move to the organic light-emitting layer 302 through the electron transport layer 303 under an action of the voltage, and holes in the anode 200 move to the organic light-emitting layer 302 through the hole transport layer 301 under the action of the voltage. The electrons and the holes combine in the organic light-emitting layer 302 to generate excitons, which excite the organic light-emitting layer 302 to emit light, thereby realizing the self-luminescence.

When the organic light-emitting layer 302 has different types of organic molecular materials, light of different colors is emitted. In this case, at least three OLED devices emitting light of three primary colors may be provided in a pixel unit of the OLED display panel. As shown in FIG. 1, the three OLED devices may be located in a red sub-pixel R, a green sub-pixel G and a blue sub-pixel B, respectively. In addition, by adjusting the voltage applied to the anode 200 and the cathode 400 of the OLED device at a different position in the display panel, a luminous intensity of the OLED device may be changed, thereby realizing display of a color screen.

It can be known from the above that the OLED device plays a vital role in a display process of the OLED display panel. Therefore, the manufacturing quality of the OLED device directly affects the display quality of the OLED display panel.

Figure 2:
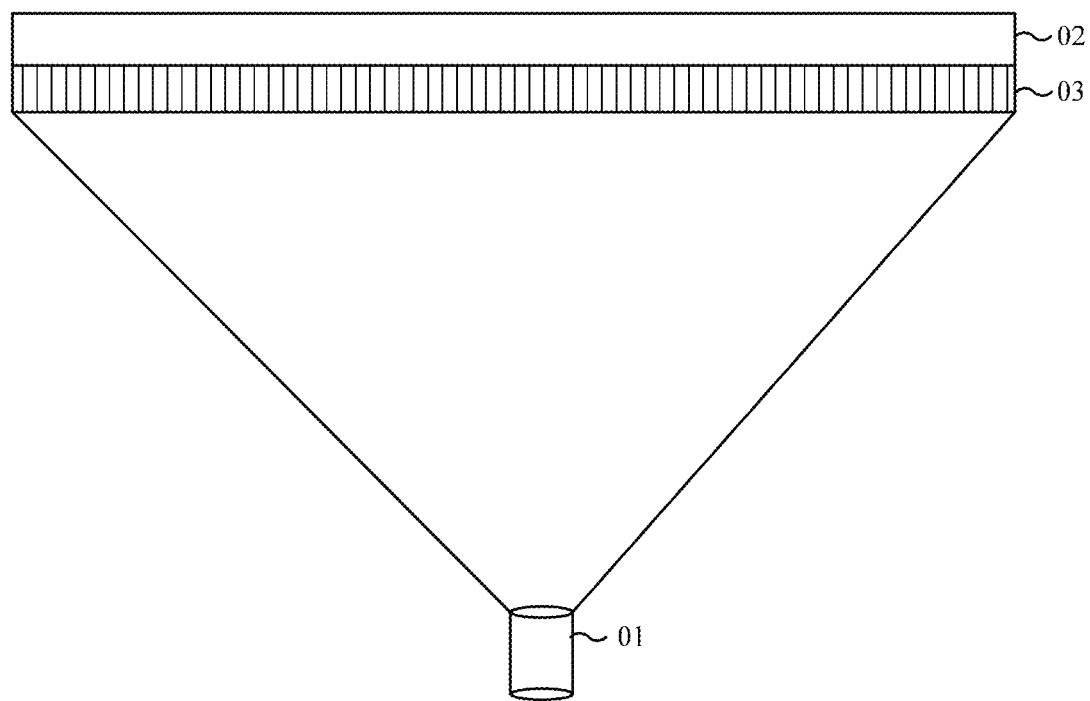
FIG. 2 is a schematic diagram showing an evaporation process of a luminous material of an OLED device, in accordance with some embodiments.

The light-emitting functional layer 300 in the OLED device, such as the organic light-emitting layer 302, the hole transport layer 301, and the electron transport layer 303, is generally manufactured by using an evaporation process. For example, as shown in FIG. 2, a material of an evaporation source 01 is evaporated by means of resistance wire heating or electron beam heating, and is deposited on a substrate to be evaporated 02 above the evaporation source 01. In order to deposit different luminescent materials on corresponding positions of the substrate to be evaporated 02, for example, in order to respectively deposit a luminescent material that may emit red light, a luminescent material that may emit green light, and a luminescent material that may emit blue light on corresponding sub-pixel positions, the mask 03 is required to be provided between the evaporation source 01 and the substrate to be evaporated 02.

The mask 03 in some embodiments of the present disclosure includes a frame 40, at least one mask sheet 30, and a shielding plate 50.

Figure 5A:
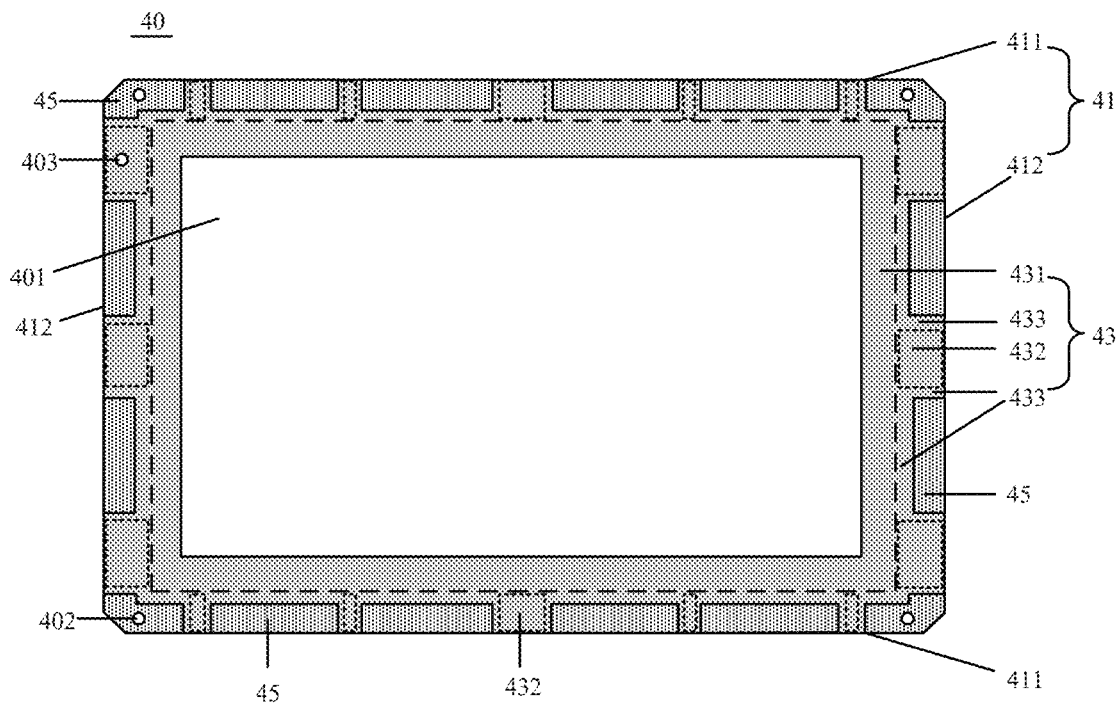
FIG. 5A is a structural diagram of a frame of a mask, in accordance with some embodiments.
Figure 5B:
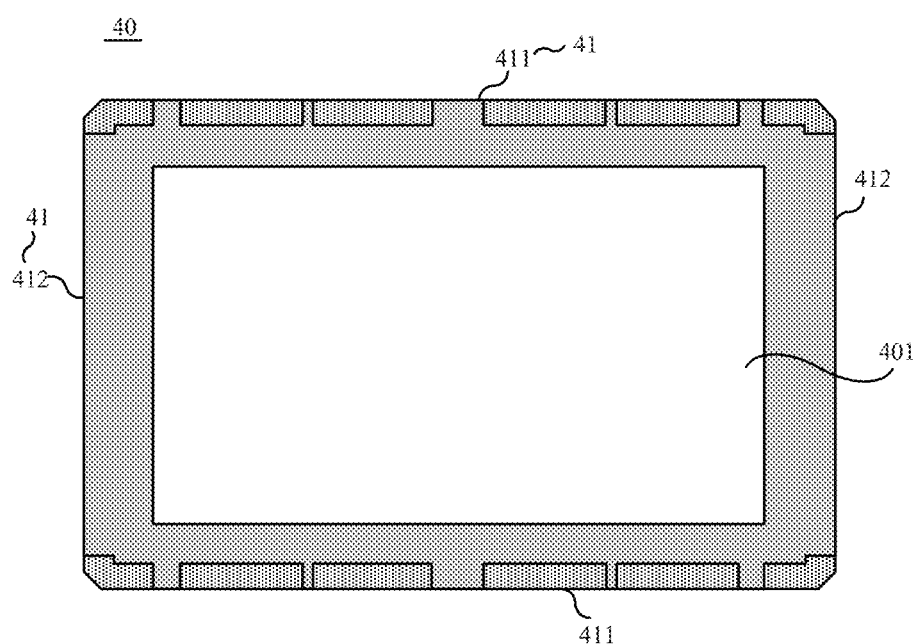
FIG. 5B is a structural diagram of another frame of a mask, in accordance with some embodiments.

As shown in FIGS. 5A and 5B, the frame 40 includes a plurality of borders 41. The plurality of borders 41 are connected end to end in sequence to from the frame 40 with a first hollow region 401. The frame 40 may be of an integrated structure, or may be formed by splicing and fixing the plurality of borders 41, which is not limited in the embodiments of the present disclosure.

It will be noted that FIGS. 5A and 5B exemplarily show that the frame 40 includes four borders 41. In some embodiments, the frame 40 includes five borders 41. In this case, the first hollow region 401 formed is in a pentagonal shape. In some embodiments, the first hollow region 401 formed by the plurality of borders 41 may be other regular polygons. The number of the borders 41 of the frame 40 is not limited in the embodiments of the present disclosure, which may be determined according to a specific shape of the substrate to be evaporated. Regardless of the shape of the frame 40, it is required to ensure that the frame 40 is of a hollow structure (the hollow portion is the first hollow region 401), so as to ensure that an evaporation material is able to be evaporated onto the substrate to be evaporated 02 through the mask sheet(s) 30 located in the first hollow region 401.

In some embodiments, the frame 40 is made of a metal material with a high strength and a low thermal expansion coefficient, so that the frame 40 has a high stability when heated, and is not easily deformed. For example, the frame 40 may be made of an iron-nickel alloy or stainless steel.

Figure 3:
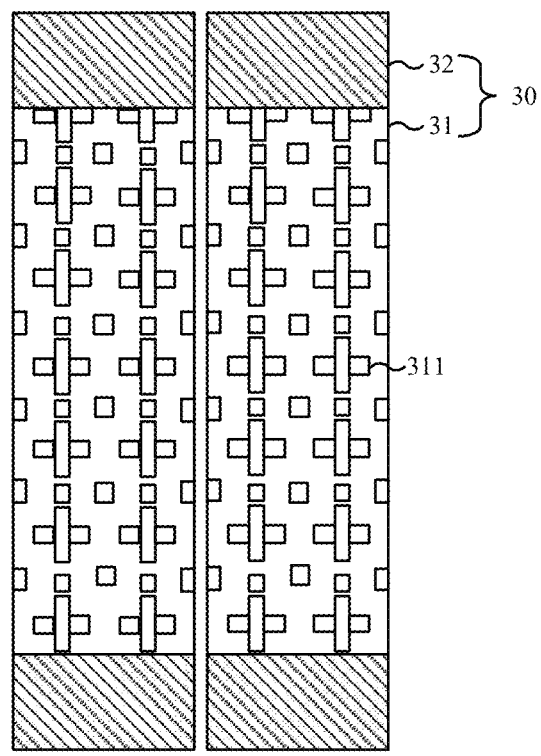
FIG. 3 is a structural diagram of a mask sheet, in accordance with some embodiments.

As shown in FIG. 3, the mask sheet 30 includes a pattern region 31 and non-pattern regions 32. At least one evaporation hole 311 is provided on the pattern region 31, and the evaporation hole 311 corresponds to a position of a pattern to be formed on the substrate to be evaporated 02. The material of the evaporation source 01 is evaporated and deposited on a position of the substrate to be evaporated 02 where deposition is needed through the evaporation hole 311. The non-pattern regions 32 are configured to be fixed to the frame 40 to fix the mask sheet 30 on the frame 40, and the non-pattern region 32 has no evaporation holes 311.

In some embodiments, the mask sheet 30 is made of a material with a low thermal expansion coefficient and a high stability, so that the evaporation hole 311 of the mask sheet 30 may have a high precision, so as to ensure an accuracy of an evaporation pattern. For example, the mask sheet 30 is made of an iron-nickel alloy.

Figure 4:
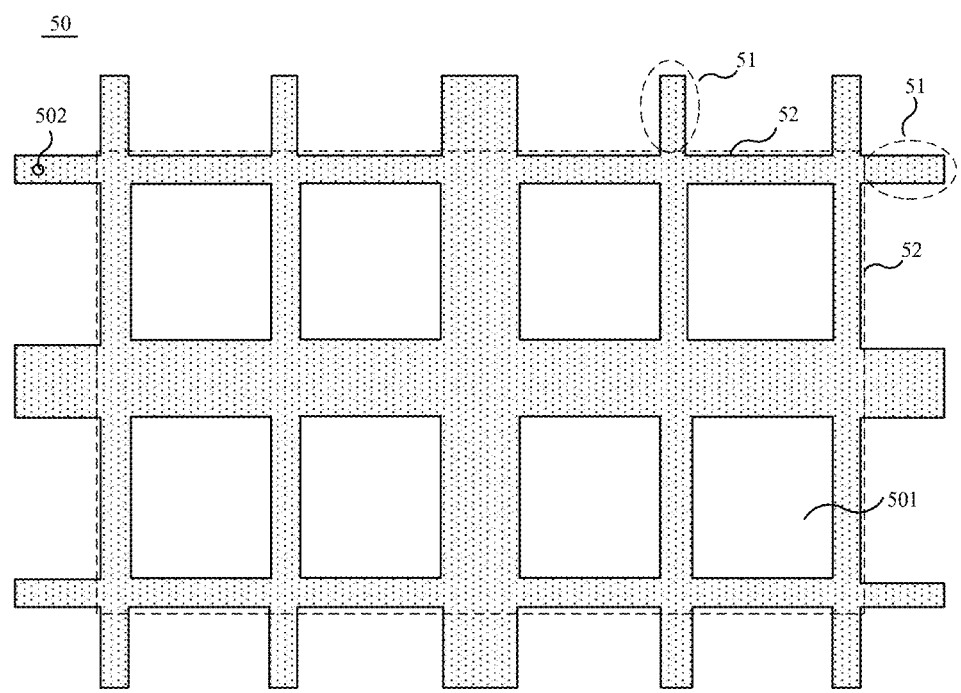
FIG. 4 is a structural diagram of a shielding plate, in accordance with some embodiments.

As shown in FIG. 4, the shielding plate 50 includes a plurality of stretching pins 51 and a plurality of shielding strips 52, and the plurality of shielding strips 52 are arranged in a criss-cross manner to form a plurality of second hollow regions 501. In FIG. 4, the structure inside the rectangular dashed line frame has the shielding strips 52, and the structure outside the rectangular dashed line frame has the stretching pins 51. The stretching pins 51 are configured to stretch the shielding plate 50 on the frame 40 by stretching the stretching pins through a stretcher when the shielding plate 50 is stretched. The shielding strips 52 are configured to shield a portion between two adjacent mask sheets 30 and a portion of the substrate to be evaporated 02 where the evaporation material is not required to be deposited. In this case, the evaporation hole 311 in the pattern region 31 of the mask sheet 30 that is not shielded by the shielding plate 50 is an effective evaporation hole.

In some embodiments, the substrate to be evaporated 02 is a mother substrate, and several tens or hundreds of small substrates may be obtained by cutting the mother substrate. These small substrates may be used to manufacture various display devices such as computer monitors, televisions, tablet computers, game consoles, mobile phones and PDAs. In this case, the portion of the substrate to be evaporated 02 where the evaporation material is not required to be deposited includes, for example, a spacing region between two adjacent small substrates, and a peripheral region of the entire substrate to be evaporated 02.

In some embodiments, the shielding plate 50 is made of an iron-nickel alloy or stainless steel, and has a high strength and a low thermal expansion coefficient, so as to avoid high-temperature deformation.

Figure 7A:
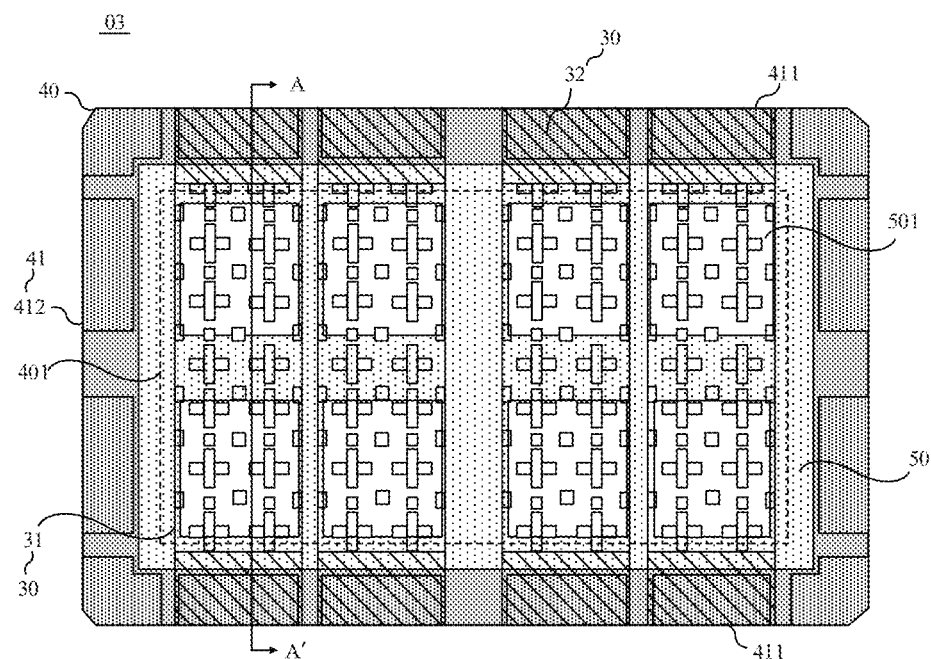
FIG. 7A is a structural diagram of a mask, in accordance with some embodiments.
Figure 7B:
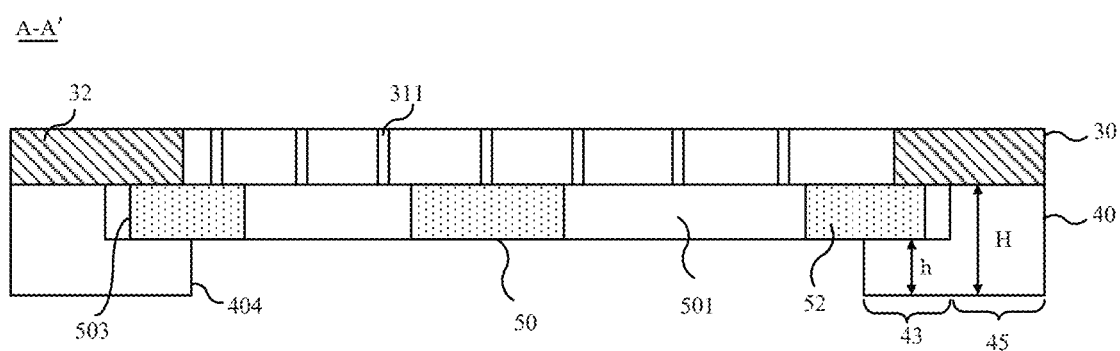
FIG. 7B is a sectional view taken along the A-A' direction in FIG. 7A.

The following description is made in an example where the frame 40 includes four borders. As shown in FIGS. 7A and 7B, the plurality of borders 41 includes two first borders 411 arranged opposite to each other and two second borders 412 arranged opposite to each other. The mask sheet 30 is fixed on the frame 40, and the mask sheet 30 spans the first hollow region 401 of the frame 40. The non-pattern regions 32 of the mask sheet 30 are fixed to the first borders 411 of the frame 40, and the pattern region 31 of the mask sheet 30 corresponds to the first hollow region 401. In some embodiments, the mask sheet 30 is welded to the first borders 411.

The shielding plate 50 is provided on a side of the mask sheet 30 proximate to the frame 40, and the shielding plate 50 is fixed on the frame 40. That is, the shielding plate 50 and the mask sheet 30 are sequentially fixed on the frame 40 in a thickness direction of the frame 40. Orthogonal projections of the plurality of second hollow regions 501 on a plane perpendicular to the thickness direction of the frame 40 are located within a range of an orthogonal projection of the first hollow region 401 on the plane.

Figure 6A:
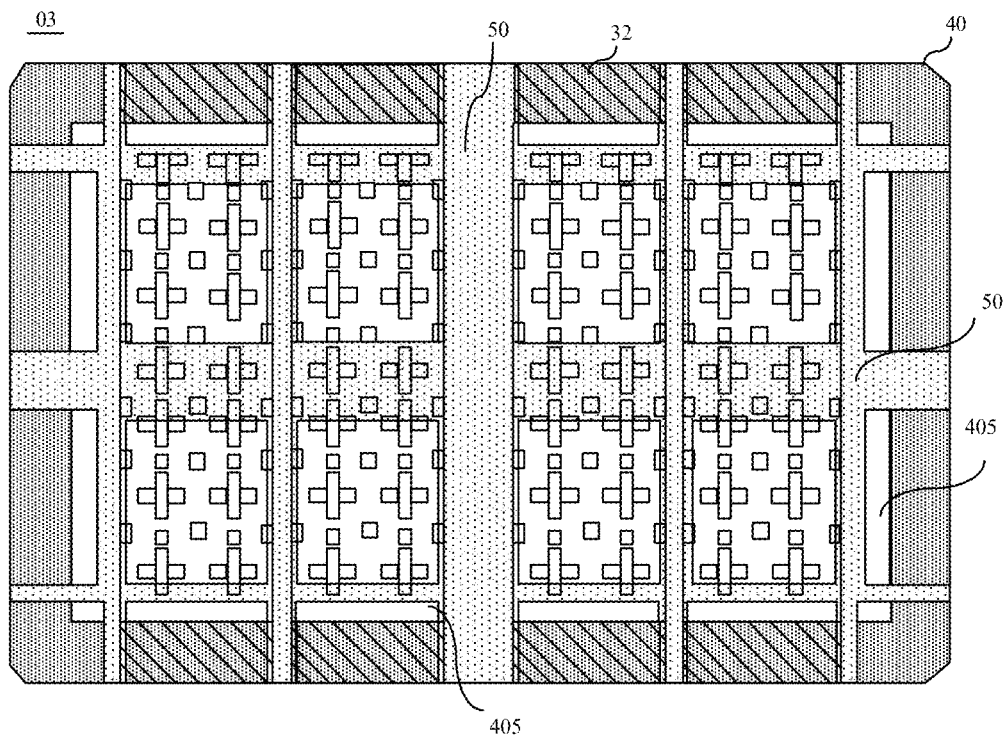
FIG. 6A is a structural diagram of a mask, in accordance with some related embodiments.

In some related embodiments, as shown in FIG. 6A, there are gaps 405 between an inner edge 404 of the frame 40 and an outer edge 503 of the shielding plate 50. During the evaporation process, the evaporation material passes through the gaps 405, and is deposited on the substrate to be evaporated 02, which results in an unnecessary deposition and an influence on a yield of a product. The inner edge 404 of the frame 40 refers to an edge of a side of the borders 41 proximate to outermost shielding strips of the shielding plate 50. The outer edge 503 of the shielding plate 50 refers to an edge of a side of the outermost shielding strips of the shielding plate 50 proximate to the frame 40.

Figure 6B:
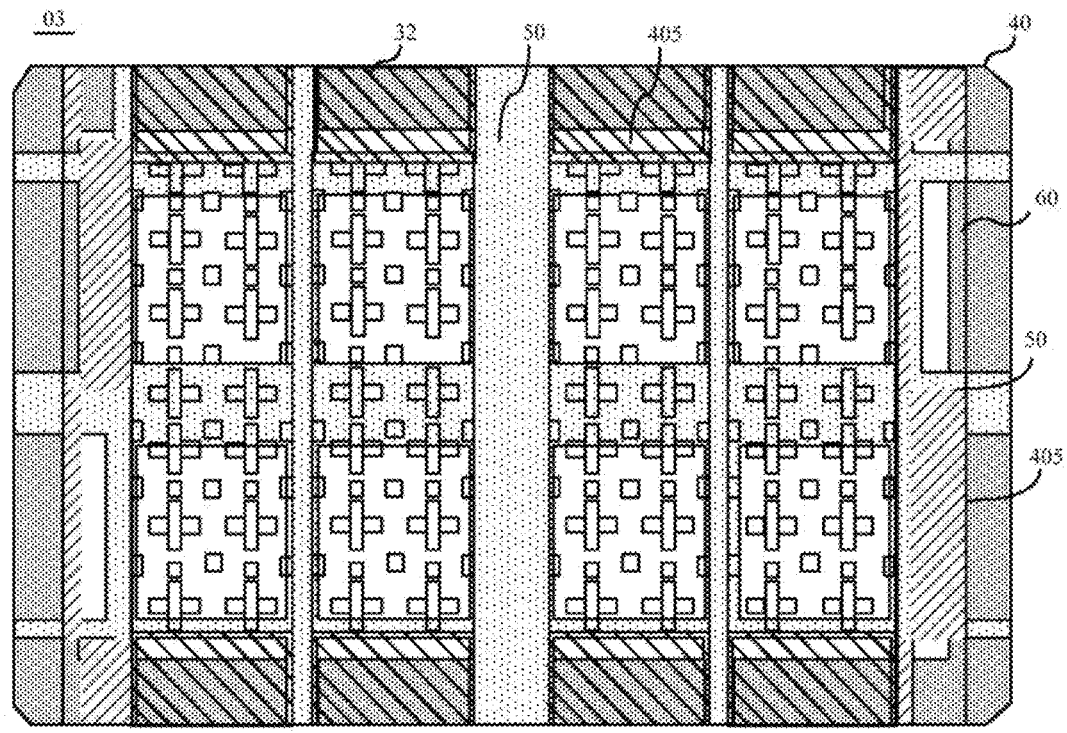
FIG. 6B is a structural diagram of another mask, in accordance with some related embodiments.

For this reason, in some related embodiments, as shown in FIG. 6B, the gaps 405 are shielded by enlarging the non-pattern regions 32 of the mask sheet 30 and adding alignment shielding sheets (also called alignment masks) 60. In this way, on one hand, a size of the pattern region 31 of the mask sheet 30 is limited, and on another hand, additional shielding sheets are required to be added, which causes waste of cost.

In the mask 03 provided by some embodiments of the present disclosure, as shown in FIG. 7B, the inner edge of an orthogonal projection of the frame 40 on the plane is located within a range of an orthogonal projection of the shielding plate 50 on the plane. Here, the orthogonal projection of the shielding plate 50 includes orthogonal projections of the shielding strips 52, but does not include orthogonal projections of the stretching pins 51.

In this way, there is no gap between the inner edge 404 of the frame 40 and the outer edge 503 of the shielding plate 50. During evaporation, the evaporation material can only pass through the evaporation hole 311, so that a deposition position of the evaporation material on the substrate to be evaporated 02 is accurate, thereby avoiding the influence on the yield of the product caused by the evaporation material diffusing to the substrate to be evaporated 02 from the gaps described above.

As shown in FIGS. 5A and 7B (a sectional view taken along the A-A' direction in FIG. 7A), in some embodiments, the frame 40 includes a first region 43 and a second region 45. The first region 43 includes a portion of the frame 40 fixed to the shielding strips 52, i.e., a shielding strip fixing region 431. The second region 45 includes a portion of the frame 40 fixed to the mask sheet(s) 30. The second region 45 is closer to the outer edge of the frame 40 than the first region 43.

On this basis, in order to enable the shielding plate 50 and the mask sheet(s) 30 to be sequentially fixed on the frame 40, as shown in FIG. 7B, a thickness h of the first region 43 is less than a thickness H of the second region 45. The shielding strip fixing region 431 is a portion of the first region 43, and a thickness of the shielding strip fixing region 431 is the thickness h of the first region.

In some embodiments, after the shielding plate 50 and the mask sheet(s) 30 are fixed on the frame 40, there is no gap between the shielding plate 50 and the mask sheet(s) 30 in the thickness direction of the frame 40. A difference between the thickness H of the second region 45 and the thickness h of the first region 43 is equal to a thickness of the shielding plate 50 (or the shielding strip 52). In this way, an influence on an accuracy of the deposition position of the evaporation material on the substrate to be evaporated 02 may be avoided, which is caused by the evaporation material diffusing from the gaps between the shielding plate 50 and the mask sheet(s) 30 during evaporation.

It will be noted that the difference between the thickness H of the second region 45 and the thickness h of the first region 43 may not be completely equal to the thickness of the shielding plate 50 due to an influence of a processing accuracy. In order to avoid an influence of the gaps between the shielding plate 50 and the mask sheet(s) 30 in the thickness direction of the frame 40 on the deposition position of the evaporation material on the substrate to be evaporated 02, the difference in thickness between the second region 45 and the first region 43 is required to be as close as possible to the thickness of the shielding plate 50.

For example, in some embodiments, a thickness reduction process is performed on a side surface of a frame body with a thickness H in a thickness direction of the frame body to form the first region 43, and a remaining region not subjected to the thickness reduction process is the second region 45. Or, in some embodiments, a plurality of protrusions are provided on (e.g., adhered to) a side surface of a frame body with a thickness h in a thickness direction of the frame body. All the protrusions jointly form the second region 45, and a remaining region without the protrusions is the first region 43.

In addition, before fixing the shielding plate 50 on the frame 40, it is required to stretch the shielding plate 50 on the frame. On this basis, for the convenience of stretching the shielding plate 50 on the frame 40, as shown in FIG. 5A, the first region 43 further includes pin accommodating regions 432 configured to accommodate the stretching pins 51 of the shielding plate 50 in addition to the shielding strip fixing region 431.

In addition, in order to facilitate the assembly of the shielding plate 50 and avoid the inability of the shielding plate 50 to be stretched and fixed on the frame 40 due to processing errors, in some embodiments, as shown in FIG. 5A, the first region 43 further includes fitting allowance regions 433. The fitting allowance regions 433 are configured to assemble the shielding plate 50. The fitting allowance regions 433 are located between the shielding strip fixing region 431 and the second region 45, and between the pin accommodating regions 432 and the second region 45.

On this basis, in some embodiments, as shown in FIG. 5A, the first region 43 and the second region 45 are included in the first borders 411 and the second borders 412. The first region 43 includes the shielding strip fixing region 431, the pin accommodating regions 432, and the fitting allowance regions 433. Or, in some other embodiments, as shown in FIG. 5B, the first region 43 and the second region 45 are included in the first borders 411. The first region 43 is further included in the second borders. In this way, it is possible to facilitate the processing and the manufacturing of the frame 40.

In some embodiments, the frame 40 further includes first alignment holes, and the first alignment holes are non-overlapped with the mask sheet 30 and the shielding plate 50. The first alignment holes are configured to align the mask sheet 30 when the mask sheet 30 is stretched on the frame 40, so as to ensure a stretching accuracy. The first alignment holes may be located at, for example, four corners of the frame 40, and symmetrically distributed.

For example, as shown in FIG. 5A, the first alignment hole 402 is an opening in the border 41. Or, in some embodiments, a small alignment block may be drilled and welded to the frame 40 to form the first alignment hole 402. The small alignment block with an opening may be formed separately, or may be formed by using a portion of an existing alignment shielding sheet 60 that retains an alignment hole (a remaining portion of the alignment shielding sheet 60 other than the alignment hole may be removed).

When the mask sheet 30 is stretched on the frame 40, in an example where the four corners of the frame 40 are each provided with the first alignment hole 402, an intersection point of lines of the first alignment holes 402 at diagonal corners is taken as an origin of a coordinate system, and a distance between the mask sheet 30 and the intersection point is controlled by the stretcher to realize the alignment of the mask sheet 30 and the frame 40.

In addition, a third alignment hole 502 is provided in the stretching pin 51 of the shielding plate 50. A second alignment hole 403 is provided at a position of the pin accommodating region 432 of the frame 40 corresponding to the third alignment hole 502. When the shielding plate 50 is stretched on the frame 40, the third alignment hole 502 in the stretching pin is aligned with the second alignment hole 403 in the pin accommodating region 432.

Figure 8A:
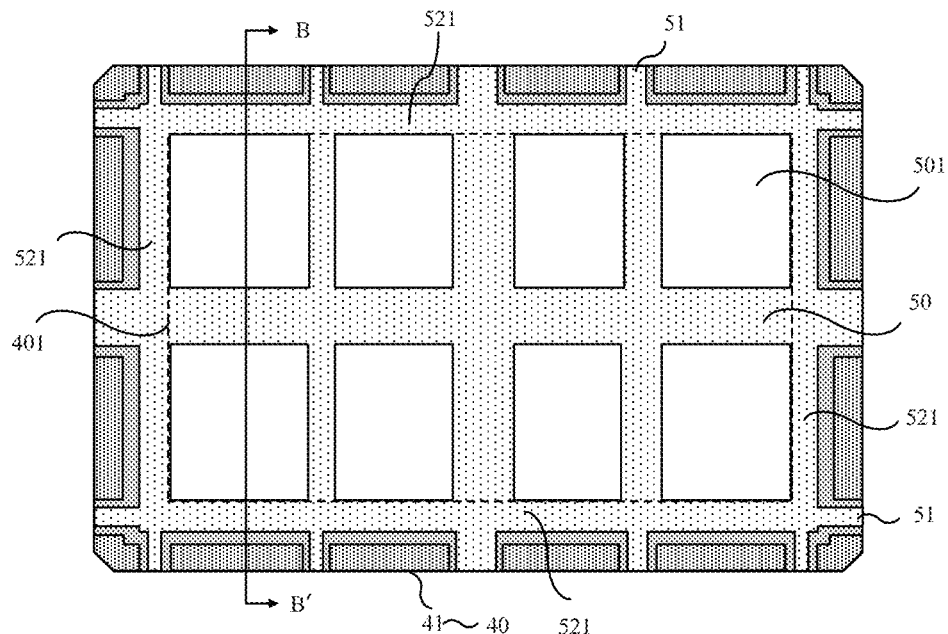
FIG. 8A is a diagram showing a positional relationship between a frame and a shielding plate of a mask, in accordance with some embodiments.

In some embodiments, as shown in FIG. 8A, the plurality of shielding strips 52 of the shielding plate 50 include a plurality of border shielding strips 521 that are in one-to-one correspondence with the borders 41.

Figure 8B:
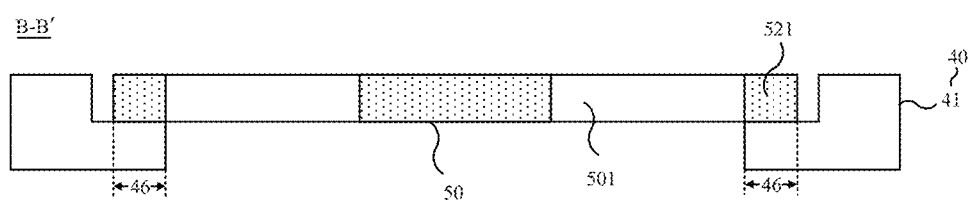
FIG. 8B is a sectional view taken along the B-B' direction in FIG. 8A.

On this basis, as shown in FIGS. 8A and 8B (a sectional view taken along the B-B' direction in FIG. 8A), in some embodiments, an orthogonal projection of the border shielding strip 521 on the border 41 is located within a region 46 where the border 41 corresponding to the border shielding strip 521 is located. That is, the border shielding strip 521 is entirely located on the border 41. In this way, an area of the second hollow region 501 is increased, so that an area of an effective evaporation region may be increased. When a product design is performed, a screen may be extended toward an edge of a substrate, which improves a utilization rate of the substrate.

Figure 9A:
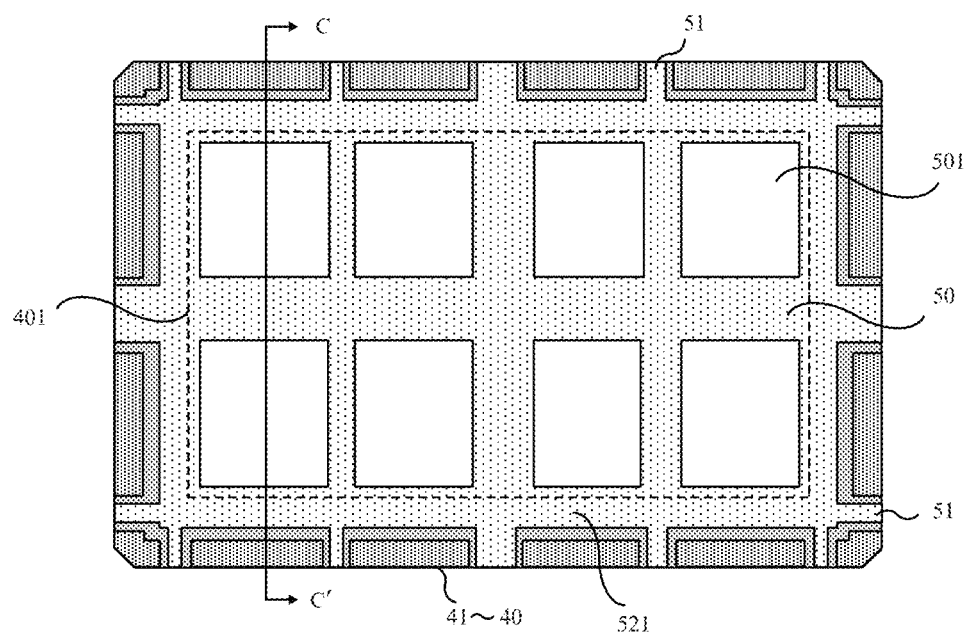
FIG. 9A is a diagram showing another positional relationship between a frame and a shielding plate of a mask, in accordance with some embodiments.
Figure 9B:
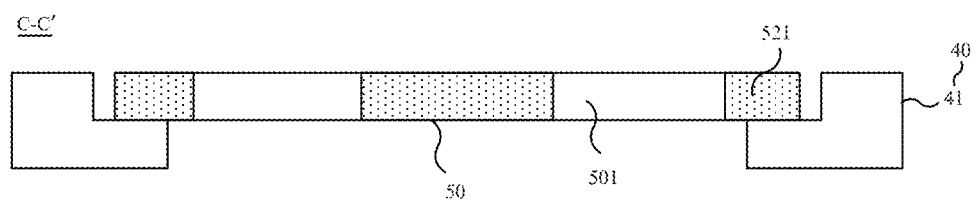
FIG. 9B is a sectional view taken along the C-C' direction in FIG. 9A.

Or, in some other embodiments, as shown in FIGS. 9A and 9B (a sectional view taken along the C-C' direction in FIG. 9A), for any border shielding strip 521, the orthogonal projection of the border shielding strip 521 on the plane is partially overlapped with an orthogonal projection of the border 41 corresponding to the border shielding strip 521 on the plane. That is, a portion of the border shielding strip 521 is located on the border 41, and a portion extends to the first hollow region 401. In this way, it is possible to avoid an influence of the edge of the border 41 on an evaporation accuracy.

Figure 10A:
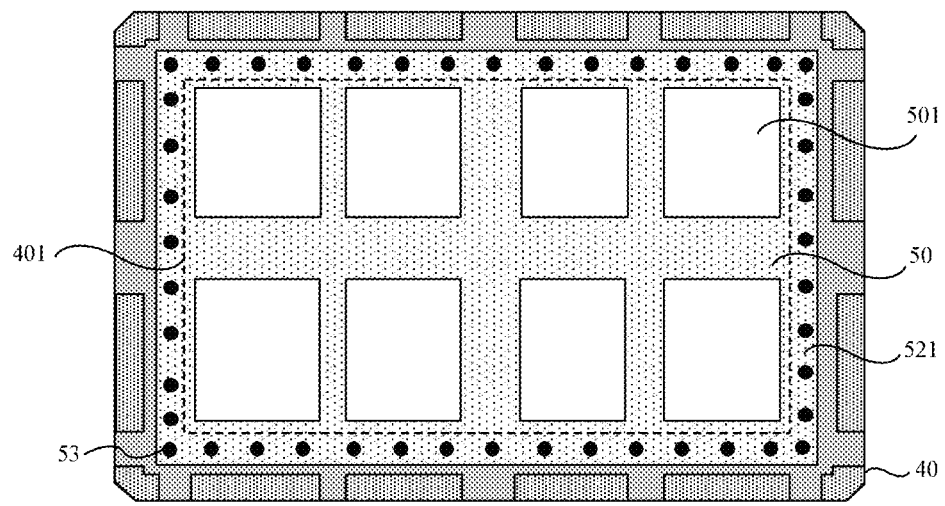
FIG. 10A is a schematic diagram showing a method of fixing a frame and a shielding plate of a mask, in accordance with some embodiments.

On this basis, in some embodiments, as shown in FIG. 10A, the shielding plate 50 is fixed on the frame 40 only by the border shielding strips 521. In this case, after the shielding plate 50 is fixed, the stretching pins 51 of the shielding plate 50 may be cut off. Thus, an influence on the mask sheet(s) caused by thermal deformation of the stretching pins 51 during the evaporation process is avoided.

Figure 10B:
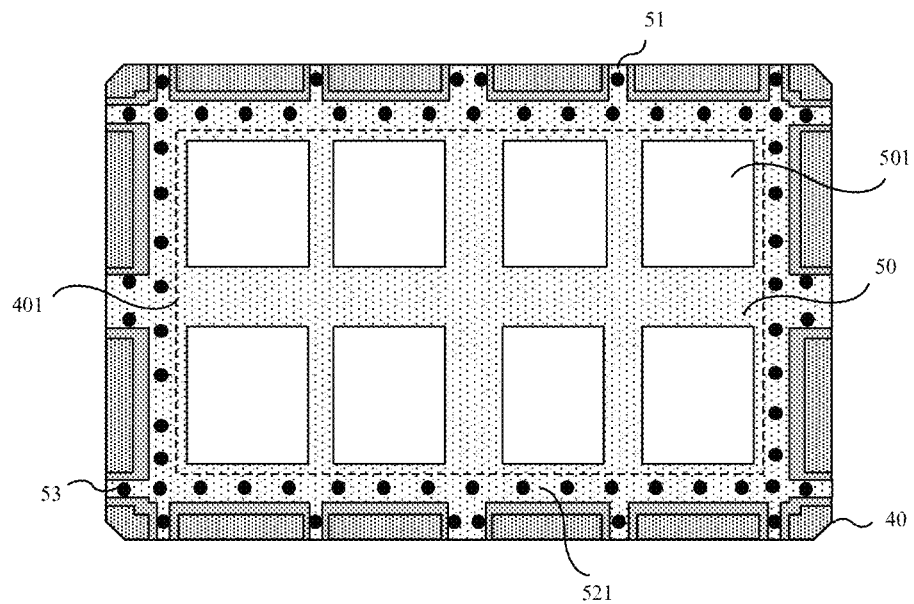
FIG. 10B is a schematic diagram showing another method of fixing a frame and a shielding plate of a mask, in accordance with some embodiments.

Or, in some other embodiments, as shown in FIG. 10B, the stretching pin 51 is also fixed on the frame 40. In this way, there may be more positions for fixing, which is beneficial to improve a fixing strength between the stretching pin 51 and the frame 40, and make the fixing more stable.

The fixing mode described above may be a welding fixing. Welding points 53 (circles in the figure) are schematically shown in FIGS. 10A and 10B.

It can be seen from the above that, in the mask 03 provided by some embodiments of the present disclosure, there is an overlapping region between the border shielding strip 521 and the border 41, so that there is no gap between the border 41 and the shielding plate 50. Therefore, it is not required to add an additional alignment shielding sheet 60, and it is not required to enlarge the non-pattern region 32 of the mask sheet 30 to shield some of the gaps.

In this case, as shown in FIG. 11, in some embodiments, in a direction (i.e., the up-down direction in FIG. 11) of a line connecting the two opposite first borders 411, a length of the pattern region 31 of the mask sheet 30 is greater than a length of the first hollow region 401. In this way, when a product is designed, an arrangement position of a screen on a substrate may be proximate to an edge of the substrate, which improves a utilization rate of the substrate.

In addition, some embodiments of the present disclosure provide a manufacturing method of a mask for manufacturing the mask 03. As shown in FIG. 12, the manufacturing method of the mask 03 includes S101 and S102.

In S101, referring to FIG. 8A or 9A, the shielding plate 50 is stretched and welded to the first region 43 of the frame 40, and the inner edge of the orthogonal projection of the frame 40 on the plane is located within the range of the orthogonal projection of the shielding plate 50 on the plane.

It can be seen from the above description of the mask 03 that, the frame 40 includes the plurality of borders 41, and the plurality of borders 41 are connected end to end in sequence to form the frame 40 with the first hollow region 401.

In addition, the frame 40 has the first region 43 and the second region 45, and the thickness h of the first region 43 is less than the thickness H of the second region 45. The first region 43 includes the shielding strip fixing region 431 fixed to the shielding plate 50, the pin accommodating regions 432 for accommodating the stretching pins 51 of the shielding plate 50, and the fitting allowance regions 433 for assembling the shielding plate 50.

The shielding plate 50 has the plurality of second hollow regions 501. When the welding is performed, the orthogonal projections of the second hollow regions 501 on the plane perpendicular to the thickness direction of the frame 40 are located within the range of the orthogonal projection of the first hollow region 401 on the plane. In addition, in some embodiments, the shielding strips 52 of the shielding plate 50 include the plurality of border shielding strips 521 and at least one stretching pin 51 located on an outer side of each border shielding strip 521.

In this case, stretching the shielding plate 50 and welding the shielding plate 50 to the first region 43 of the frame 40, includes: placing the shielding plate 50 on the frame 40, and fixing and stretching the stretching pins 51 of the shielding plate 50 through a stretcher, so that the border shielding strips 521 are located in the shielding strip fixing region 431, and the stretching pins 51 are located in the pin accommodating regions 432; and welding the border shielding strips 521 to the corresponding borders 41.

In S102, referring to FIG. 5A, the mask sheet 30 is stretched and welded to the second region 45 of the first border 411 of the frame 40, and the mask sheet 30 and the shielding plate 50 are located on a same side of the frame 40.

The plurality of borders 41 include two first borders 411 that are opposite to each other. The thickness of the first region 43 is less than the thickness of the second region 45.

The above descriptions are merely some specific implementation manners of the present disclosure, but the protection scope of the present disclosure is not limited to thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A mask, comprising:
   a frame including a plurality of borders, the plurality of borders being connected end to end in sequence to form the frame with a first hollow region;
   at least one mask sheet, each mask sheet including a pattern region and non-pattern regions, the pattern region including at least one evaporation hole, and the non-pattern regions being configured to be fixed to the frame, so that the pattern region is opposite to the first hollow region; and
   a shielding plate including a plurality of shielding strips, the plurality of shielding strips being arranged crosswise to form a plurality of second hollow regions, and orthogonal projections of the second hollow regions on a plane perpendicular to a thickness direction of the frame being located within a range of an orthogonal projection of the first hollow region on the plane,
   wherein the shielding plate and the at least one mask sheet are sequentially fixed on the frame in the thickness direction of the frame, and an inner edge of an orthogonal projection of the frame on the plane is located within a range of an orthogonal projection of the shielding plate on the plane;
   wherein the plurality of shielding strips include a plurality of border shielding strips, and the plurality of border shielding strips are in one-to-one correspondence with the plurality of borders; and
   for any border shielding strip of the plurality of border shielding strips, an orthogonal projection of the any border shielding strip on the plane is overlapped with an orthogonal projection of a border corresponding to the any border shielding strip on the plane.

2. The mask according to claim 1, wherein the frame includes a first region and a second region;
   the first region includes a portion of the frame fixed to the plurality of shielding strips, the portion of the frame fixed to the plurality of shielding strips is a shielding strip fixing region, and the second region includes a portion of the frame fixed to the at least one mask sheet; and
   a thickness of the first region is less than a thickness of the second region, and the second region is closer to an outer edge of the frame than the first region.

3. The mask according to claim 2, wherein a difference between the thickness of the second region and the thickness of the first region is equal to a thickness of the shielding plate.

4. The mask according to claim 1, wherein for the any border shielding strip of the plurality of border shielding strips, the orthogonal projection of the any border shielding strip on the frame is located within a region where the border corresponding to the any border shielding strip is located.

5. The mask according to claim 1, wherein for the any border shielding strip of the plurality of border shielding strips, the orthogonal projection of the any border shielding strip on the plane is partially overlapped with the orthogonal projection of the border corresponding to the any border shielding strip on the plane.

6. The mask according to claim 3, wherein the shielding plate further includes at least one stretching pin located on an outer side of each border shielding strip.

7. The mask according to claim 6, wherein the first region further includes pin accommodating regions configured to accommodate stretching pins.

8. The mask according to claim 7, wherein the first region further includes fitting allowance regions;
the fitting allowance regions are located between the shielding strip fixing region and the second region, and between the pin accommodating regions and the second region.

9. The mask according to claim 2, wherein the plurality of borders include two first borders that are opposite to each other and two second borders that are opposite to each other;
the first region and the second region are included in the first borders and the second borders.

10. The mask according to claim 2, wherein the plurality of borders include two first borders that are opposite to each other and two second borders that are opposite to each other;
the first region and the second region are included in the first borders; and
the first region is further included in the second borders.

11. The mask according to claim 10, wherein a length of the pattern region is greater than a length of the first hollow region in a direction of a line connecting the two first borders that are opposite to each other.

12. The mask according to claim 1, wherein the frame further includes first alignment holes that are non-overlapped with the at least one mask sheet and the shielding plate.

13. The mask according to claim 7, wherein the frame further includes a second alignment hole, and the at least one stretching pin further includes a third alignment hole;
when the shielding plate is stretched on the frame, the second alignment hole is aligned with the third alignment hole.

14. The mask according to claim 1, wherein the frame and the shielding plate are made of an iron-nickel alloy or stainless steel; and
the at least one mask sheet is made of an iron-nickel alloy.

15. The mask according to claim 1, wherein the frame and the shielding plate are fixed in a welding manner; and
the frame and the at least one mask sheet are fixed in the welding manner.

16. A manufacturing method of a mask for manufacturing the mask according to claim 1, wherein
the frame includes a first region and a second region, a thickness of the first region is less than a thickness of the second region, and the second region is closer to an outer edge of the frame than the first region;
the manufacturing method comprises:
stretching the shielding plate and welding the shielding plate to the first region of the frame, the inner edge of the orthogonal projection of the frame on the plane being located within the range of the orthogonal projection of the shielding plate on the plane; and
stretching the at least one mask sheet and welding the at least one mask sheet to the second region of the frame, the at least one mask sheet and the shielding plate being located on a same side of the frame;
wherein the plurality of shielding strips include a plurality of border shielding strips, and the plurality of border shielding strips are in one-to-one correspondence with the plurality of borders;
the inner edge of the orthogonal projection of the frame on the plane being located within the range of the orthogonal projection of the shielding plate on the plane, includes:
for the any border shielding strip of the plurality of border shielding strips, the orthogonal projection of the any border shielding strip on the plane is overlapped with the orthogonal projection of the border corresponding to the any border shielding strip on the plane.

17. The manufacturing method according to claim 16, wherein the shielding plate further includes at least one stretching pin located on an outer side of each border shielding strip,
the first region includes a shielding strip fixing region and pin accommodating regions;
stretching the shielding plate and welding the shielding plate to the first region of the frame, includes:
placing the shielding plate on the frame, and fixing and stretching pins of the shielding plate through a stretcher, so that the plurality of border shielding strips are located in the shielding strip fixing region, and the stretching pins are located in the pin accommodating regions;
welding the plurality of border shielding strips to the shielding strip fixing region; and
welding the stretching pins to the pin accommodating regions.

18. The manufacturing method according to claim 16, wherein the shielding plate further includes at least one stretching pin located on an outer side of each border shielding strip;
the first region includes a shielding strip fixing region and pin accommodating regions;
stretching the shielding plate and welding the shielding plate to the first region of the frame, includes:
placing the shielding plate on the frame, and fixing and stretching pins of the shielding plate through a stretcher, so that the plurality of border shielding strips are located in the shielding strip fixing region, and the stretching pins are located in the pin accommodating regions;
welding the plurality of border shielding strips to the shielding strip fixing region; and
removing the stretching pins.

19. The manufacturing method according to claim 16, wherein for the any border shielding strip of the plurality of border shielding strips, the orthogonal projection of the any border shielding strip on the plane being overlapped with the orthogonal projection of the border corresponding to the any border shielding strip on the plane, includes:
for the any border shielding strip of the plurality of border shielding strips, the orthogonal projection of the any border shielding strip on the frame being located within a region where the border corresponding to the any border shielding strip is located; or,
for the any border shielding strip of the plurality of border shielding strips, the orthogonal projection of the any border shielding strip on the plane being partially overlapped with the orthogonal projection of the border corresponding to the any border shielding strip on the plane.

20. The mask according to claim 9, wherein a length of the pattern region is greater than a length of the first hollow region in a direction of a line connecting the two first borders that are opposite to each other.

* * * * *